(12) United States Patent
Cohn et al.

(10) Patent No.: US 7,373,263 B2
(45) Date of Patent: May 13, 2008

(54) ANALOG-TYPE MEASUREMENTS FOR A LOGIC ANALYZER

(75) Inventors: Robert C. Cohn, Beaverton, OR (US);
Susan C. Adam, Portland, OR (US);
Mark A. Briscoe, Beaverton, OR (US);
Andrew Loofburrow, Portland, OR (US); Eric E. Thums, Portland, OR (US)

(73) Assignee: Tektronix, Inx., Beaverton, OR (US)

( * ) Notice: Subject to any disclaimer, the term of this patent is extended or adjusted under 35 U.S.C. 154(b) by 52 days.

(21) Appl. No.: 11/435,571

(22) Filed: May 16, 2006

(65) Prior Publication Data

US 2007/0271067 A1   Nov. 22, 2007

(51) Int. Cl.
*G06F 19/00* (2006.01)
*G06F 17/40* (2006.01)
*G06F 17/10* (2006.01)
*G01R 13/20* (2006.01)
*G01R 19/00* (2006.01)
*G01R 31/00* (2006.01)
*G01R 31/26* (2006.01)

(52) U.S. Cl. .................. 702/57; 324/76.11; 324/76.12; 324/76.38; 324/500; 324/537; 324/765; 702/66; 702/67; 702/68; 702/108; 702/119; 702/123; 702/189

(58) Field of Classification Search ............. 324/76.11, 324/76.12, 76.38, 76.39, 76.77, 500, 537, 324/556, 765; 702/1, 57, 66, 67, 68, 69, 702/79, 108, 117, 118, 119, 123, 127, 179, 702/189
See application file for complete search history.

(56) References Cited

U.S. PATENT DOCUMENTS

| | | | | |
|---|---|---|---|---|
| 4,072,851 A * | 2/1978 | Rose | ............................ | 702/68 |
| 4,099,240 A * | 7/1978 | Rode et al. | .................... | 702/85 |
| 4,104,725 A * | 8/1978 | Rose et al. | .................... | 702/68 |
| 4,162,531 A * | 7/1979 | Rode et al. | .................... | 702/68 |
| 4,812,996 A * | 3/1989 | Stubbs | ......................... | 702/123 |
| 4,868,785 A * | 9/1989 | Jordan et al. | ................ | 345/440 |
| 4,974,181 A * | 11/1990 | Sinderson et al. | ........... | 702/182 |
| 5,155,836 A * | 10/1992 | Jordan et al. | .................. | 703/23 |
| 5,594,663 A * | 1/1997 | Messaros et al. | ............ | 702/184 |
| 5,646,521 A * | 7/1997 | Rosenthal et al. | ........ | 324/158.1 |
| 5,748,124 A * | 5/1998 | Rosenthal et al. | ........... | 341/120 |
| 5,939,877 A * | 8/1999 | Alexander | .............. | 324/121 R |
| 5,953,009 A * | 9/1999 | Alexander | ................... | 715/771 |
| 6,054,984 A * | 4/2000 | Alexander | ................... | 715/771 |
| 6,201,384 B1 * | 3/2001 | Alexander | .............. | 324/121 R |
| 6,246,408 B1 * | 6/2001 | Alexander | ................ | 345/440.1 |
| 6,326,986 B1 * | 12/2001 | Alexander | ................... | 715/764 |

(Continued)

*Primary Examiner*—Edward R Cosimano
(74) *Attorney, Agent, or Firm*—Thomas F. Lenihan; Michael A. Nelson (57) ABSTRACT

A logic analyzer that performs analog-type measurements on digital data includes circuitry in its acquisition system that is programmable to search through acquired data to detect analog-type signal characteristics. In a first embodiment, the logic analyzer includes a graphical user interface employing a drag-and-drop operation to apply one or more selected analog-type measurements to selected portions of the digital data record. In a second embodiment, a user may designate a particular waveform or data listing by means of a mouse-click. Each of the choices of analog-type measurements can be represented by an icon, or text, or both icon and text. Some of the analog-type measurements, among others, are pulse width, duty cycle, period, frequency, period jitter, and cycle-to-cycle jitter

27 Claims, 7 Drawing Sheets

U.S. PATENT DOCUMENTS

| | | | |
|---|---|---|---|
| 6,326,987 B2 * | 12/2001 | Alexander | 715/771 |
| 6,407,756 B1 * | 6/2002 | Sontag et al. | 715/771 |
| 6,466,006 B2 * | 10/2002 | Alexander | 324/121 R |
| 6,570,592 B1 * | 5/2003 | Sajdak et al. | 715/769 |
| 6,615,369 B1 | 9/2003 | Beck et al. | |
| 6,624,829 B1 | 9/2003 | Beck et al. | |
| 6,690,398 B1 * | 2/2004 | Beck et al. | 715/771 |
| 7,225,359 B2 * | 5/2007 | Beck et al. | 714/30 |
| 7,257,509 B2 * | 8/2007 | Pauly et al. | 702/127 |
| 2001/0000964 A1 * | 5/2001 | Alexander | 345/440 |
| 2001/0001137 A1 * | 5/2001 | Alexander | 702/68 |
| 2004/0125139 A1 * | 7/2004 | Beck et al. | 345/764 |
| 2004/0225924 A1 * | 11/2004 | Beck et al. | 714/39 |
| 2005/0240852 A1 * | 10/2005 | Inaba et al. | 714/740 |
| 2007/0061629 A1 * | 3/2007 | Thums et al. | 714/39 |
| 2007/0088529 A1 * | 4/2007 | Nygaard, Jr. | 702/189 |

* cited by examiner

| | | | |
|---|---|---|---|
| ⎍ | Period | ⎍ | Frequency |
| ⎍ | Positive Duty Cycle | ⎍ | Negative Duty Cycle |
| ⎍ | Positive Pulse Width | ⎍ | Negative Pulse Width |
| ⎍ | Channel to Channel Delay | ◨ | Pattern Match |
| ⎍ | Edge Count | ⎍ | Cycle Count |
| ⎍ | Positive Pulse Count | ⎍ | Negative Pulse Count |
| ⎍ | Violation Count | ⎍ | Violation Rate |
| ⎍ | Group Min | ⎍ | Group Max |
| ⎍ | Period Jitter | ⎍ | Cycle-to-Cycle Jitter |

ANALOG-TYPE MEASUREMENTS FOR A LOGIC ANALYZER

FIELD OF THE INVENTION

The subject invention concerns the fields of test and measurement instruments in general, and specifically concerns a novel user interface for use in a Logic Analyzer.

BACKGROUND OF THE INVENTION

A logic analyzer is a test and measurement instrument that is extremely useful for troubleshooting digital circuits involving numerous signals. Like an oscilloscope, a logic analyzer captures signals from a System Under Test (SUT) and displays a representation of those signals on a display screen. Unlike an oscilloscope, which typically has up to four input channels, a logic analyzer may have 32, 64, 128 or more input channels. Oscilloscopes acquire signal data representative of analog characteristics of the signal, such as specific amplitude values, rise times, fall times, etc. A logic analyzer is concerned with logic levels (0 and 1) and timing relationships between the signals.

Data records acquired by a logic analyzer can be very long, for example up to 64 Meg samples on each channel. While the ability to capture such a large amount of data is certainly a desirable feature for a logic analyzer, identifying specific data within a long data record is often a daunting task for a user. For example, a user may need to know how many occurrences (counts) of specific characteristics of digital data have been recorded. Alternatively, users may want to average certain data values, or compute statistics on their data sets using measurement capabilities similar to those in digital oscilloscopes.

Currently, such a user must export digital data sets to an external computer and use a statistical spreadsheet type package (e.g., Microsoft Excel® software), or some custom program, to calculate these counts, averages and other statistics on these data sets. Exporting such large data sets, and then operating on them to produce the desired results is a time consuming process. What is needed is a fast and efficient method and apparatus for producing analog-type measurements, such as, counts, averages, and statistical results, on already-acquired deep memory data records of a logic analyzer.

SUMMARY OF THE INVENTION

A logic analyzer that performs analog-type measurements on digital data includes circuitry in its acquisition system that is programmable to search through acquired data to detect analog-type signal characteristics. In a first embodiment, the logic analyzer includes a graphical user interface employing a drag-and-drop operation to apply one or more selected analog-type measurements to selected portions of the digital data record. In a second embodiment, a user may designate a particular waveform or data listing by means of a mouse-click. Each of the choices of analog-type measurements can be represented by an icon, or text, or both icon and text. Some of the analog-type measurements, among others, are pulse width, duty cycle, period, frequency, period jitter, and cycle-to-cycle jitter.

DETAILED DESCRIPTION OF THE DRAWING

Figure 1:
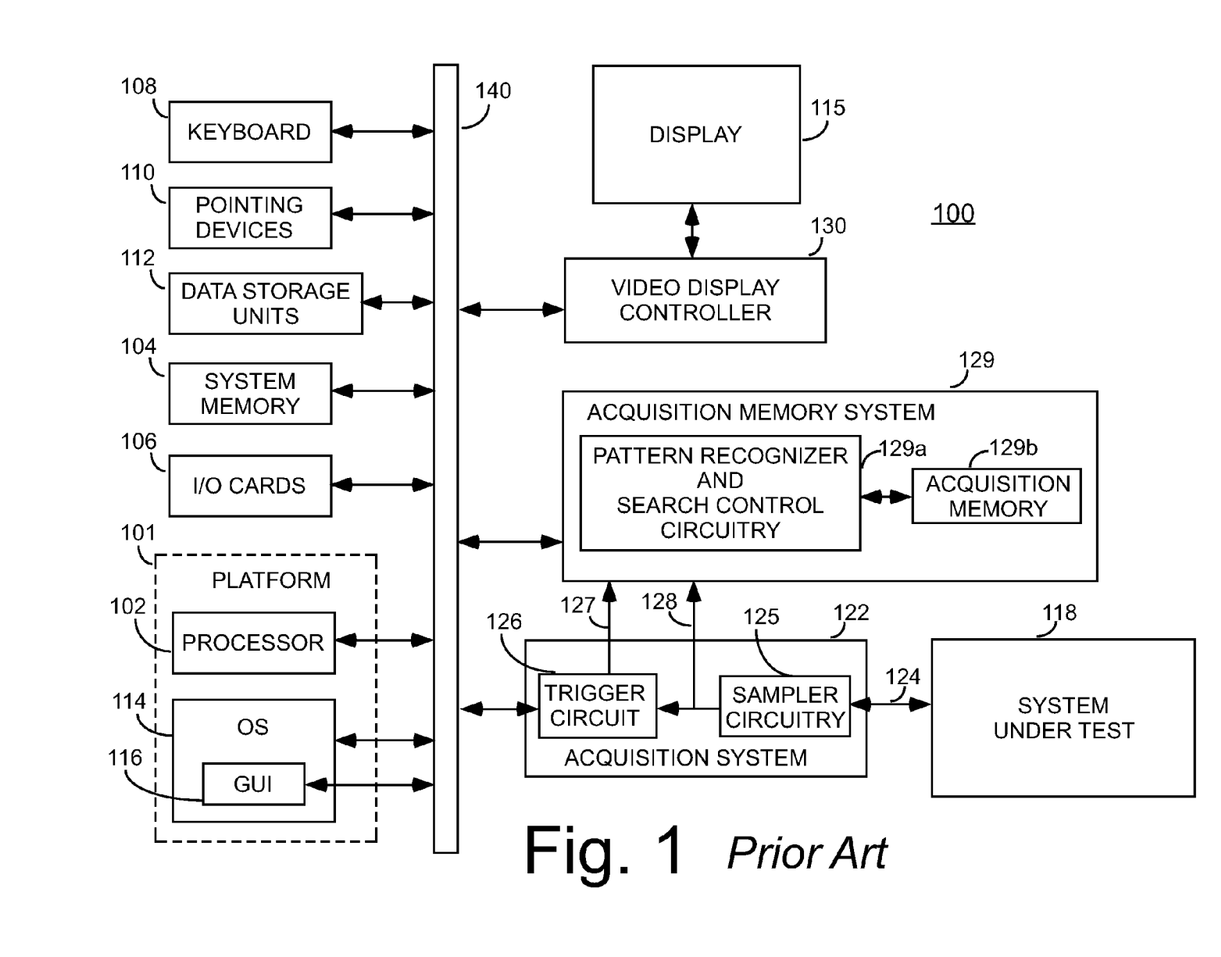
FIG. 1 shows a simplified block diagram of a logic analyzer suitable for use with the subject invention.

FIG. 1 shows, in block diagram form, a logic analyzer 100, suitable for use with the subject invention. Logic analyzer 100 includes a general purpose computing platform 101, which may be programmable using any one of a variety of high level or low level programming languages and further may include specially programmed, special-purpose hardware, software and/or firmware capable of performing signal acquisition, processing and/or display functions.

Logic analyzer 100 includes processor 102, system memory 104, input/output (I/O) cards 106, and data storage units 112, such as a hard disk drive, floppy disk drive, and so on. Logic analyzer 100 may also include one or more user input/output devices, such as keyboard 108, pointing device 110 and display unit 115. System memory 104 comprises Random Access Memory (RAM) and is typically used for storage of program instructions and/or data. Display unit 115 may include a cathode ray display, plasma, LCD, and/or other type of display, and may be logically and/or physically divided into an array of picture elements or pixels. Input/output (I/O) cards 106 may include modem cards, network interface cards, graphics cards, audio cards and/or other types of I/O cards.

Processor 102 may be any one of a number of commercially available processors, including a PA-RISC processor available from Hewlett-Packard Corporation, Palo Alto, California, or a Pentium® processor, or a Pentium® M-type processor, available from Intel Corporation, Santa Clara, California; other examples include a PowerPC® processor or a 68000 series processor, both available from Freescale Semiconductor Inc., Austin, Texas; or any combinations thereof. Processor 102 executes instructions of its associated operating system 114, and implements and controls a graphical user interface (GUI) 116 for facilitating various data processing operations for ultimate display on display unit 115. Processor 102 and operating system 114, may generally define a computing platform shown by dashed block 101, for which application programs in high level programming languages may be written. As illustrated in FIG. 1, communication among various components takes place via system bus 140.

Signals are acquired from a System Under Test (SUT) 118 by Acquisition System 122 operating under control of processor 102. Acquisition System 122 includes hardware, firmware, and software, necessary to acquire data samples at appropriate times. Acquisition system 122 receives logic signals from system under test 118 via data channels 124. The logic signals are acquired by acquisition system 122 by sampling the signals to determine their logic level. That is, a sampler 125 of acquisition system 122 can be thought of as a one-bit per channel analog-to-digital (A/D) converter, which determines whether each of the signal samples exhibits a logic level high, or a logic level low state. The sampled and digitized representation of signals 128 are continually stored in acquisition memory 129b of an Acquisition Memory System 129 until a trigger event is detected by a trigger circuit 126, which causes generation of a trigger signal 127. At that point, in response to trigger signal 127, the writing of data to acquisition memory 129b is stopped and the acquired data in acquisition memory 129b is transferred elsewhere within logic analyzer 100 for further processing. For an explanation of a novel drag and drop apparatus and method for setting up acquisition triggering for a logic analyzer, see copending U.S. patent application Ser. No. 11,437,243, entitled DRAG AND DROP LOGIC ANALYZER TRIGGER, filed on May 19, 2007, and assigned to the same assignee as the subject application. Logic analyzer 100 may also include video display controller 130 for controlling the display on display unit 115, video display controller 130 being under control of computing platform 101 using standard Windows® applications program interfaces (APIs). Acquisition Memory System 129 also includes a Pattern Recognition and Search Control Circuitry portion 129a, the function of which will be explained below.

As mentioned above, a user may need to know how many occurrences (counts) of specific characteristics of digital data have been recorded. Alternatively, the user may want to average certain data values, or perform other statistics from their data sets. Such analog-type counts and average measurements are frequently used on oscilloscopes, but heretofore have not existed on any logic analyzer for operations on digital data.

If a user were to manually attempt to set up a logic analyzer to acquire the data needed to create a file for export from the logic analyzer application to another application for analysis necessary to produce the desired counts and average values, he would need to execute a rather complex four step process. The user must first identify a specific subset of data to which the measurement should be applied, for example, which probe channel is to be selected. The user must then "gate" the selected channel data (i.e., define a relevant time segment of, or number of samples of, the selected channel data over which the measurement should be calculated). Third, the user must export the acquired data from the logic analyzer application to another application for processing and analysis, and finally, the user must communicate to the other application the type of measurement that is desired. If the user wants to aggregate measurements, then steps 3 and 4 would have to be repeated. In that case, the user must also specify whether the desired measurement will be carried out for a single data acquisition or for repeated data acquisitions.

The subject invention provides a much easier way for a user to make measurements automatically on a logic analyzer, thus removing complexity and saving a great amount of time for the user.

Figure 2:
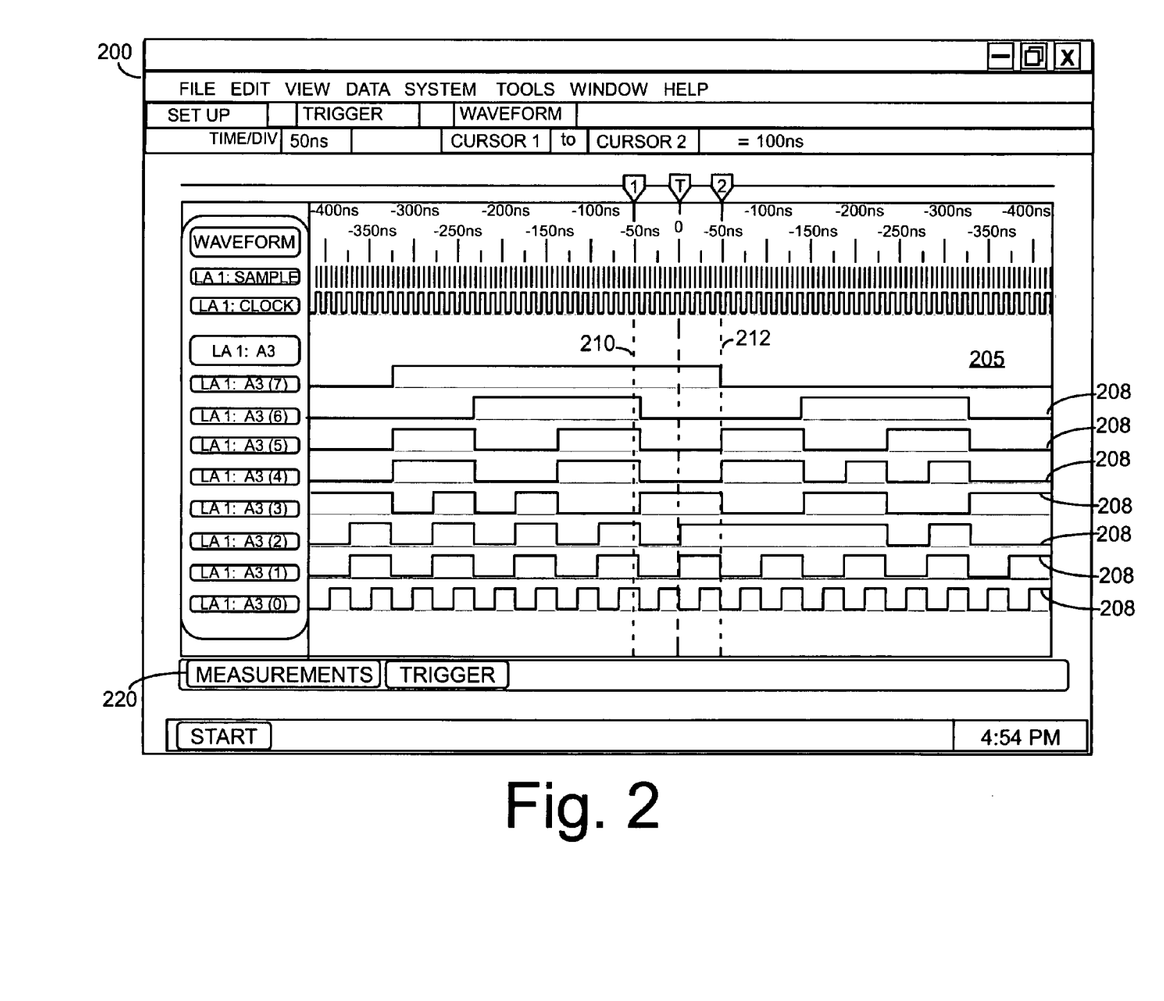
FIG. 2 shows a screen display produced by the logic analyzer of FIG. 1 in accordance with the subject invention.

There are only two built-in digital data measurements in use in currently available logic analyzer products. The first is a delta time, or a delta sample, measurement, provided in logic analyzers manufactured by Agilent Technologies, Inc. of Palo Alto, Calif. and by Tektronix, Inc. of Beaverton, Oreg. FIG. 2 shows a screen display 200 having a waveform display portion 205 showing a number of acquired waveforms 208. The waveform data display 208 shows waveforms acquired from a data bus, LA 1: A3, with the channels of that data bus shown in detail, as LA 1: A3[0]-LA 1: A3[7]. A trigger point T is indicated on the display with time measured plus and minus from that point. Screen display 200 has a pair of user-positionable cursors 210, 212. The delta time measurement simply displays the difference in time between cursors 210, 212 or between marks located in a data set. One skilled in the art will recognize that this is still a manual measurement, and that there is no easy way to aggregate such cursor measurements over an entire data acquisition. The second built-in measurement is provided only in Agilent logic analyzers. These Agilent logic analyzers provide a feature wherein a text box containing the value of a single pulse width is displayed when a mouse pointer is made to hover over a given pulse in a displayed waveform. One skilled in the art will note that this too, is a manual operation, and that there is, once again, no easy way to aggregate this measurement beyond a single waveform period.

Figure 3:
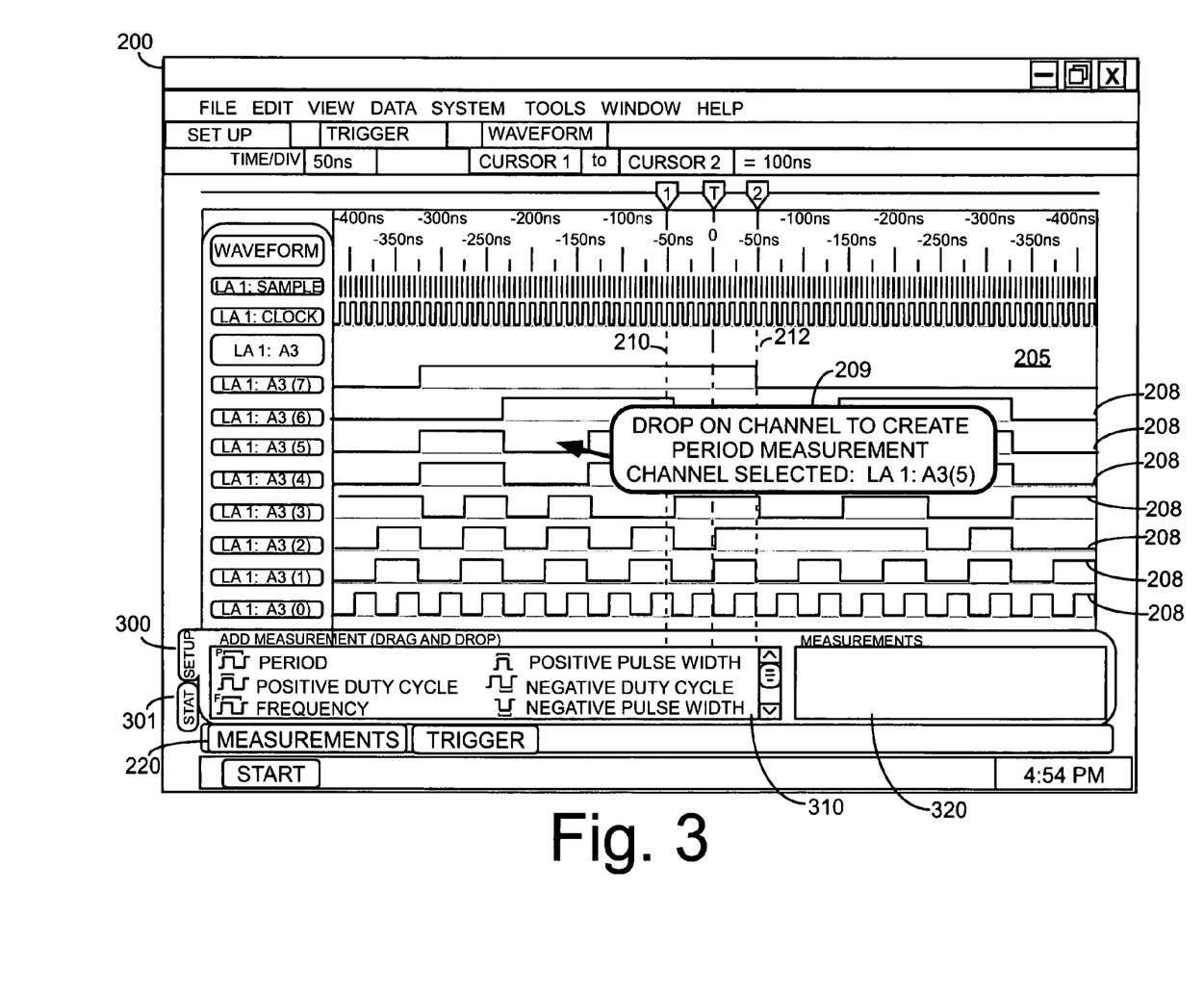
FIG. 3 shows another screen display in accordance with the subject invention.
Figure 4A:
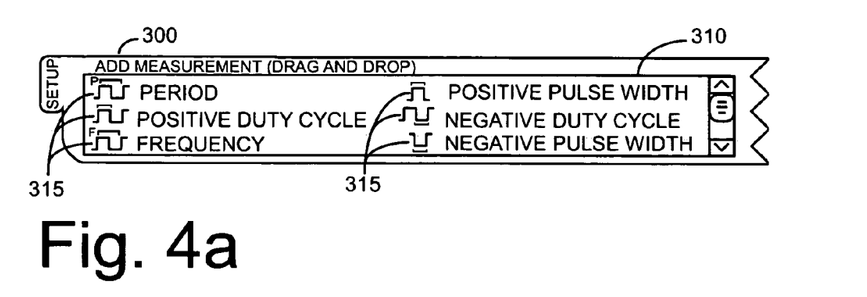
FIGS. 4a, 4b, 4c, and 4d show enlarged views of a portion of the screen display of FIG. 3.
Figure 4B:
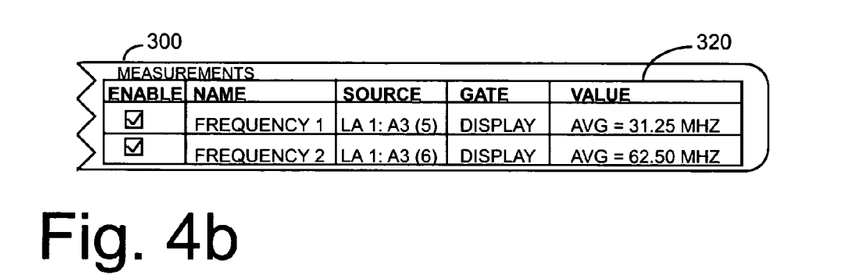
Figure 4C:
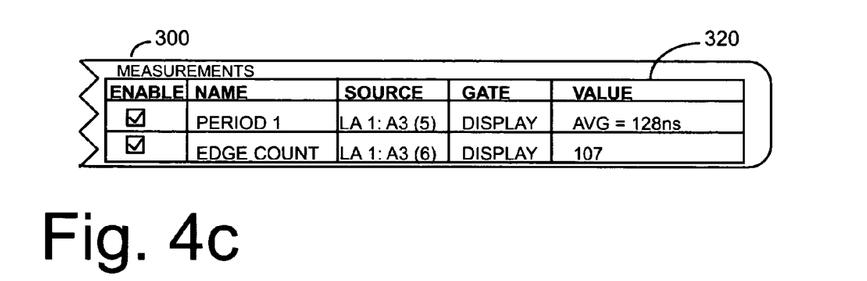
Figure 5:
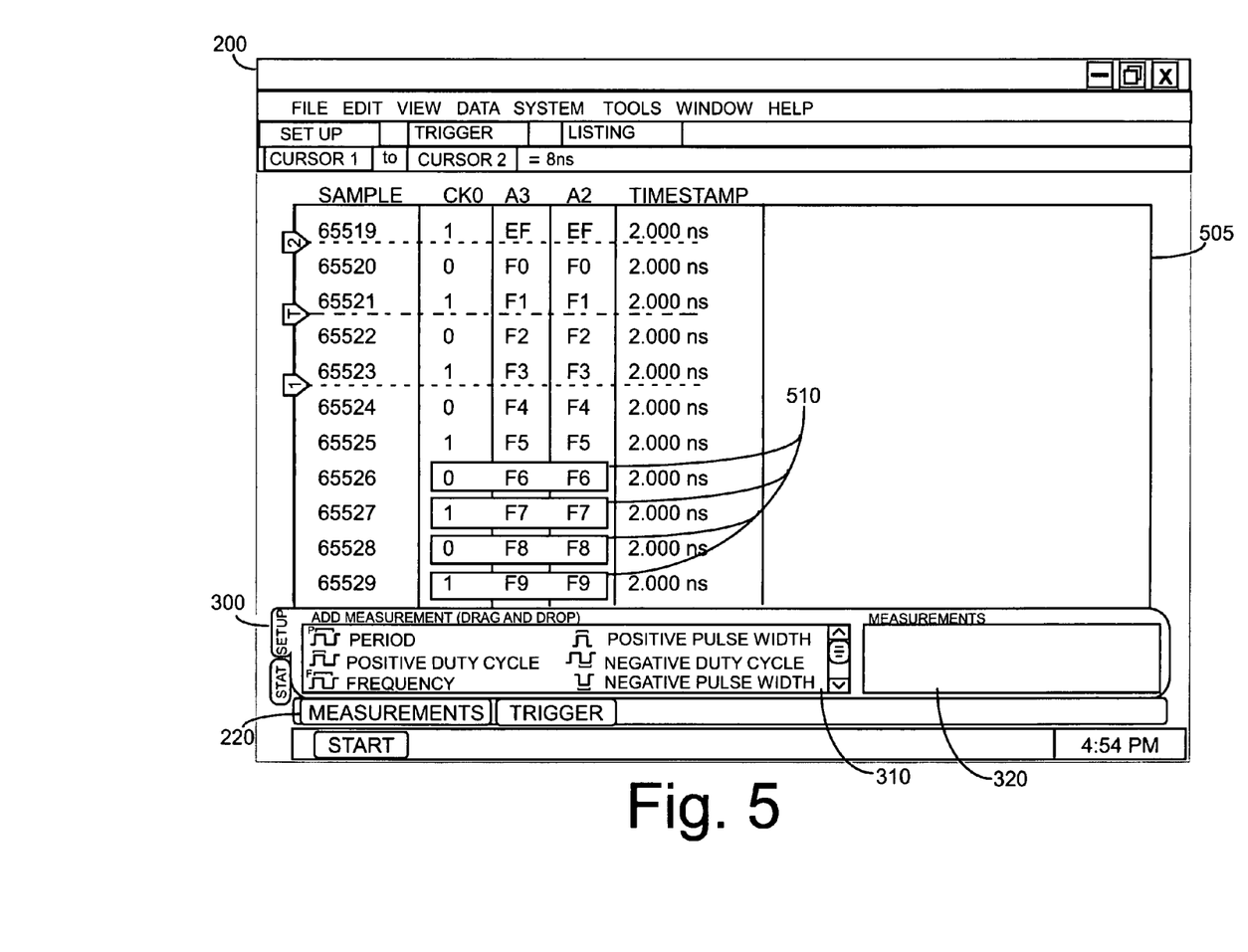
FIG. 5 shows a Listing view display in accordance with the subject invention.

The subject invention will now be described with further reference to FIG. 2 and with reference to FIGS. 3 through 5. Note that FIG. 2 has a measurement tab 220. The effect of opening measurement tab 220 is shown in FIG. 3 and in the enlarged illustrations of FIGS. 4a, 4b, and 4c. That is, opening measurement tab 220, causes a display of a setup panel 300 containing a menu sub-panel 310, and a measurements sub-panel 320. Menu sub-panel 310 shows a number of selectable elements 315. Each of selectable elements 315 corresponds to a unique analog-type measurement that can be applied to digital data. Preferably, each of selectable elements 315 (i.e., each measurement) is represented by an icon and by an explanatory label. The measurements section 320 is filled-in automatically with measurement results when a particular icon is dragged and dropped on a portion of a waveform. FIG. 4c, in particular, shows a quick way for a user to define multiple measurements, by simply dragging and dropping a number of them onto a waveform. Measurements portion 320 has an ENABLE check box for each measurement row which is initially checked (i.e., active). The check box allows a user to disable measurements as he sees fit.

As noted above, each of these analog-type measurements is set up by simply dragging its corresponding icon into waveform display portion 205 and dropping the icon onto a particular one of displayed waveforms 208. As an aid to the user, a text box 209 is displayed to provide additional instruction to the user when an icon is moved into waveform portion 205. The identification of the selected data channel and other relevant information required for the set up of the desired data measurement are thereafter automatically derived from the drop point on the waveform. It is herein recognized that such measurements can be applied more than once to different digital data channels, and that the measurements can be aggregated to calculate statistics over repeated data acquisitions. One skilled in the art will recognize that statistics can also be computed on multiple samples of a single acquisition.

In operation, information regarding the selected measurement type, the identification of the selected data channel, and the other relevant information required for the set up of the desired data measurement are automatically derived from the drop point on the waveform, and all such information is transferred to processor 102. In response, processor 102 programs Pattern Recognizer and Search Control Circuitry 129a of acquisition memory system 129 to scan the relevant data stored in acquisition memory 129b for waveform characteristics corresponding to the desired analog-type measurement. Acquisition memory system 129 alerts processor 102 each time it detects waveform characteristics corresponding to the desired analog-type measurement, and processor 102 updates its statistics accordingly. By using acquisition memory system 129 for this new purpose, a considerable time saving may be realized in that there is no need to export the data to an external computer for analysis. Moreover, additional time savings are also realized in that operations do not have to be performed on the entire data set, but rather only that data identified by the user.

It is herein recognized that this new automatic analog-type measurement capability can be applied to two data views: the Waveform view, as described above, which shows graphical digital data, and also to a Listing view, which shows tabular digital data. FIG. 5 shows such a tabular view, or Listing view, of the acquired data wherein samples 65519 through 65529 are illustrated. Each of the above-mentioned analog-type measurements is set up by simply dragging its corresponding icon into a listing display portion 505 and dropping the icon onto a particular one or more of displayed listing segments which is then surrounded by a box 510 to indicate selection for measurement. A text box (not shown) similar to text box 209 may be displayed to provide additional instruction to the user when an icon is moved into listing portion 505. The identification of the selected data channel and other relevant information required for the set up of the desired data measurement are thereafter automatically derived from the drop point, or drop points, on the listing. It is herein recognized that such measurements can be applied more than once to different digital data channels, and that the measurements can be aggregated to calculate statistics over repeated data acquisitions.

Figure 4D:
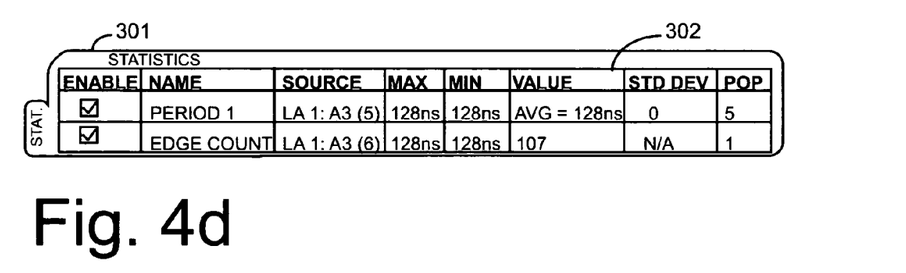

Returning to FIG. 3, a Statistics panel 301 is also available for selection upon opening measurement tab 220. The effect of opening Statistics panel 301 is shown in FIG. 4d. FIG. 4d shows the Statistics panel 301 having a statistics display table 302. Statistics display table 302 provides statistical data, such as, MIN, MAX, Standard Deviation, and Population, with regard to the above-described analog-type user-selected measurements.

Figure 6:
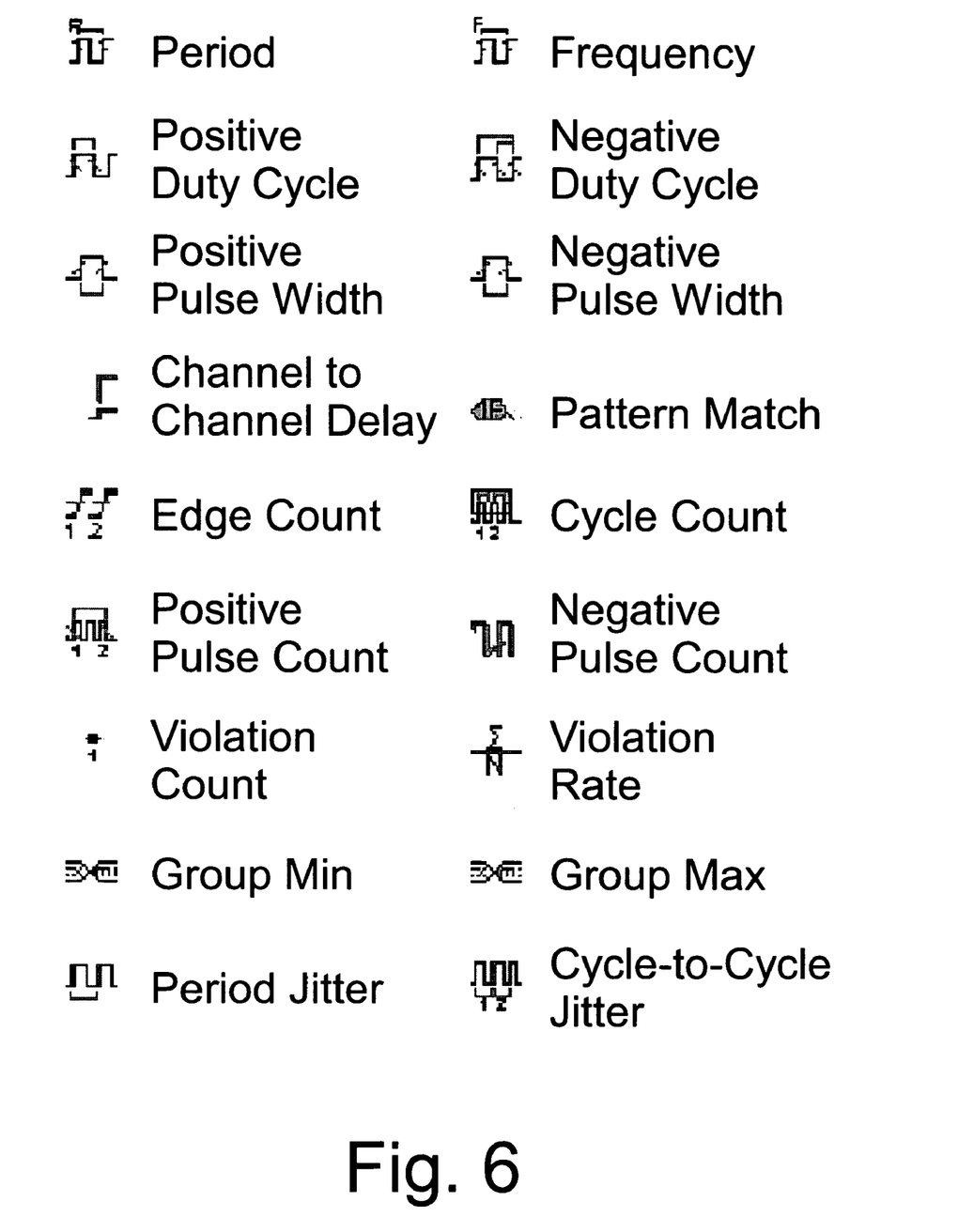
FIG. 6 shows a list of selectable measurements with associated icons in accordance with the subject invention.

FIG. 6 shows a palette of eighteen automatic analog-type measurements that can be applied to digital data in a Logic Analyzer, in accordance with the invention. As noted above, heretofore such analog-type measurements on digital data were not able to be performed automatically in response to a use selection in a logic analyzer. If performed at all, they had to be accomplished by manually setting up the measurement, doing the acquisition, and then exporting the acquired data from a logic analyzer application to another application (which may, or may not, be on an external computer) to perform that operation on the digital data. In contrast, as a result of the subject invention, such useful and important measurements as Period Jitter and Cycle-to-Cycle Jitter are much more easily accomplished within the confines of the logic analyzer. Other analog-type measurements that are provided are Channel-to-Channel Delay, Group Min which returns the minimum value for a given group of data, and Group Max which returns the maximum value for a given group of data.

Figure 7:
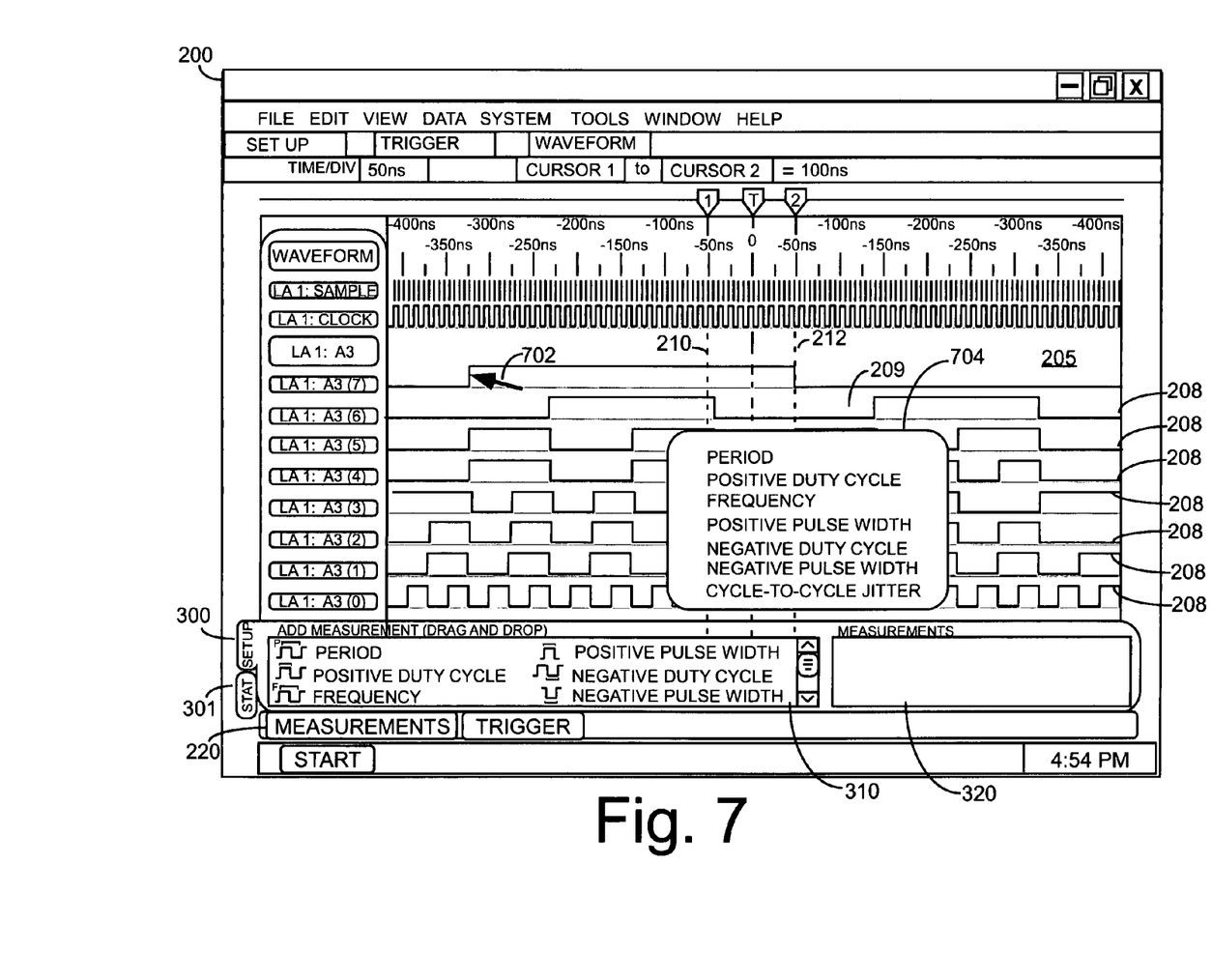
FIG. 7 shows another screen display in accordance with the subject invention.

It is herein recognized that an iconic representation for each of the analog-type measurements, such as shown in FIG. 6, is not required for one to practice the subject invention. Thus, in a second embodiment of the invention, the text labels of the analog-type measurements are dragged-and-dropped without use of the icons mentioned above. Moreover, it is further recognized that the drag-and-drop function itself is not required for one to practice the subject invention. Thus, in a third embodiment of the invention shown in FIG. 7, a cursor, or pointer, 702 of a computer mouse, trackball, or the like (not shown), may be positioned over a particular waveform and in response to a right-click of a mouse button, or similar input, designate a particular waveform for further processing. Also in response to that right-click of the mouse, a menu of analog-type measurements 704 is displayed, whereby a user may select an analog-type measurement to be applied to the digital data of that particular waveform. One skilled in the art will note that a touch screen may be used in place of a computer mouse or trackball to designate a particular waveform and cause the display of the menu of analog-type measurements. Moreover, one skilled in the art will realize that the mouse-click operation described above with respect to FIG. 7 is also equally applicable to the Listing view shown in FIG. 5, and the following claims are intended to encompass such use.

It should become apparent from the foregoing description that embodiments disclosed herein may be implemented in any one of a variety of possible forms, such as, but not limited to: hardware, such as custom integrated circuits or ASICs; firmware, such as flash memory; or software, such as special purpose or general purpose programs.

The use of the word "or" in the following claims is intended to be in the inclusive (i.e., Boolean) sense, meaning one, or the other, or both. Moreover, the use of the word "or" does not imply that both alternatives must be present; it is sufficient if either alternative is present alone, but both alternatives may be present, as well.

What is claimed is:

1. A logic analyzer, comprising:
acquisition circuitry, said acquisition circuitry acquiring samples of a digital signal from a system under test;
a memory for receiving and storing said acquired signal from said acquisition circuitry,
programmable circuitry for detecting analog-type characteristics of said digital signal and producing an output signal in response thereto;
a display unit displaying a representation of said signal samples acquired from said signal under test;
a processor controlling said acquisition circuitry, said memory, said programmable circuitry, and said display unit, for performing measurements to detect said analog-type signal characteristics of said digital signal and displaying results of said measurements on said display unit.

2. The logic analyzer of claim 1, wherein:
said processor causes a display of a graphical user interface, each of a plurality of choices of said analog-type measurements being represented in said graphical user interface by icons or text; and further including
a user input device operated by a user for entering one of said plurality of choices.

3. The logic analyzer of claim 2, wherein:
said entering of said one of said choices of said analog-type measurements is performed by a drag and drop operation performed by said user.

4. The logic analyzer of claim 3, wherein:
One of said icon or said text representation of said analog-type measurement is dragged and dropped onto one of a waveform or a listing entry displayed on said display unit.

5. The logic analyzer of claim 4, wherein:
in response to said dragging and dropping operation of one of said icon or said text representation of said analog-type measurement onto one of a waveform or a listing entry displayed on said display unit, said processor determines from said icon data relating to type of measurement desired and determines at least channel information from said drop position.

6. The logic analyzer of claim 5, wherein:
said processor programs said programmable circuitry of said acquisition system with said data determined from said drag and drop operation.

7. The logic analyzer of claim 6, wherein:
said processor retrieves said signal samples stored in said memory and causes said programmable circuitry of said acquisition system to examine said retrieved data for characteristics indicative of said desired analog-type measurement.

8. The logic analyzer of claim 7, wherein:
one of said analog-type measurements returns an average value for positive pulse widths of a waveform.

9. The logic analyzer of claim 7, wherein:
one of said analog-type measurements returns an average value for negative pulse widths of a waveform.

10. The logic analyzer of claim 7, wherein:
one of said analog-type measurements is period.

11. The logic analyzer of claim 7, wherein:
one of said analog-type measurements is frequency.

12. The logic analyzer of claim 7, wherein:
one of said analog-type measurements is positive duty cycle.

13. The logic analyzer of claim 7, wherein:
one of said analog-type measurements is negative duty cycle.

14. The logic analyzer of claim 7, wherein:
one of said analog-type measurements is channel-to-channel delay.

15. The logic analyzer of claim 7, wherein:
one of said analog-type measurements is pattern match.

16. The logic analyzer of claim 7, wherein:
one of said analog-type measurements is edge count.

17. The logic analyzer of claim 7, wherein:
said processor monitors said output of said programmable circuitry and in response thereto computes statistics on said results of said analog-type measurements.

18. The logic analyzer of claim 17, wherein:
said processor causes said display unit to display said computed statistics.

19. A logic analyzer, comprising:
acquisition circuitry, said acquisition circuitry acquiring samples of a digital signal from a system under test;
a memory for receiving and storing said acquired signal from said acquisition circuitry.
programmable circuitry for detecting analog-type characteristics of said digital signal and producing an output signal in response thereto;
a display unit displaying a waveform representative of said signal samples acquired from said signal under test;
a processor controlling said acquisition circuitry, said memory, said programmable circuitry, and said display unit, to perform measurements to detect said analog-type signal characteristics of said digital signal and display results of said measurements on said display unit; and
a user input device operated by a user to designate said waveform for further processing and to cause said processor to display a plurality of analog-type measurement choices relating to said analog-type signal characteristics, said user choosing an analog-type measurement to be applied to said designated waveform as said further processing.

20. The logic analyzer of claim 19, wherein:
said user input device is a computer mouse, a trackball, a keyboard, or a touchscreen.

21. The logic analyzer of claim 20, wherein:
a listing entry is displayed on said display unit; and
said user input device is operated by a user to designate said listing entry for further processing and to cause said processor to display a plurality of analog-type measurement choices relating to said analog-type signal characteristics, said user choosing an analog-type measurement to be applied to said designated listing entry as said further processing.

22. The logic analyzer of claim 20, wherein:
in response to said designation of said waveform or a listing entry displayed on said display unit, said processor determines at least channel information.

23. The logic analyzer of claim 22, wherein:
said processor programs said programmable circuitry of said acquisition system with said data determined from said designation and from said analog-type measurement choice.

24. The logic analyzer of claim 23, wherein:
said processor causes said programmable circuitry of said acquisition system to examine said data stored in memory for characteristics indicative of said desired analog-type measurement.

25. The logic analyzer of claim 24, wherein:
said analog-type measurements comprise one or more of:
a measurement that returns an average value for positive pulse widths of a waveform,
a measurement that returns an average value for negative pulse widths of a waveform,
a period measurement,
a frequency measurement,
a positive duty cycle measurement,
a negative duty cycle measurement,
a channel-to-channel delay measurement,
a pattern match measurement,
an edge count measurement,
a cycle count measurement,
a positive pulse count measurement,
a negative pulse count measurement,
a violation count measurement,
a violation rate measurement,
a period jitter measurement;
a cycle-to-cycle jitter measurement,
a measurement that returns a minimum value for a given group, or
a measurement that returns a maximum value for a given group.

26. The logic analyzer of claim 24, wherein:
said processor monitors said output of said programmable circuitry and in response thereto computes statistics on said results of said analog-type measurements.

27. The logic analyzer of claim 26, wherein:
said processor causes said display unit to display said computed statistics.

* * * * *